United States Patent
Achkire et al.

(10) Patent No.: US 6,749,086 B2
(45) Date of Patent: Jun. 15, 2004

(54) PRESSURIZED LIQUID DELIVERY MODULE

(75) Inventors: Younes Achkire, Santa Clara, CA (US); Johnathan Frankel, San Jose, CA (US); Brian Brown, Palo Alto, CA (US)

(73) Assignee: Applied Materials Inc., Santa Clara, CA (US)

( * ) Notice: Subject to any disclaimer, the term of this patent is extended or adjusted under 35 U.S.C. 154(b) by 372 days.

(21) Appl. No.: 09/729,128

(22) Filed: Dec. 1, 2000

(65) Prior Publication Data
US 2002/0066410 A1 Jun. 6, 2002

(51) Int. Cl.$^7$ .............. B67D 5/00; B67D 5/56; C23C 16/00
(52) U.S. Cl. .............. 222/3; 222/129.2; 118/719
(58) Field of Search .............. 222/3, 53, 56, 222/129.2; 118/719

(56) References Cited

U.S. PATENT DOCUMENTS

| | | | | |
|---|---|---|---|---|
| 5,417,346 A | * | 5/1995 | Ferri et al. .............. | 222/61 |
| 5,478,435 A | | 12/1995 | Murphy et al. .............. | 156/636.1 |
| 5,750,440 A | | 5/1998 | Vanell et al. .............. | 438/692 |
| 5,857,893 A | | 1/1999 | Olsen et al. .............. | 451/5 |
| 6,098,843 A | | 8/2000 | Soberanis et al. .............. | 222/53 |
| 6,186,745 B1 | * | 2/2001 | Johnson .............. | 417/54 |
| 6,199,599 B1 | * | 3/2001 | Gregg et al. .............. | 141/1 |

* cited by examiner

Primary Examiner—P. Hassanzedel
Assistant Examiner—Sylvia R MacArthur
(74) Attorney, Agent, or Firm—Townsend and Townsend and Crew

(57) ABSTRACT

A pressurized delivery module having two chambers enables refill of the module while liquid material continues to be supplied to a semiconductor processing tool. Initially, the chambers are in fluid communication with each other through a valve assembly, with positive pressure applied to the module from an inert gas supply. When material in the module becomes depleted, the chambers are isolated from one another to permit refilling. In the refill module state, one chamber remains pressurized, with material remaining therein continued to be dispensed to the semiconductor fabrication tool. The second chamber is vented and placed into fluid communication with the bulk material supply. Once the level of material in the second chamber has been replenished and processing of the remaining wafer has been completed, during transfer of the next incoming wafer to the tool, the second chamber is sealed off from the material supply, repressurized, and placed back into fluid communication with the first chamber.

11 Claims, 3 Drawing Sheets

PRESSURIZED LIQUID DELIVERY MODULE

BACKGROUND OF THE INVENTION

Chemical-mechanical polishing ("CMP") is a commonly used technique for planarizing material on a semiconductor wafer. CMP often requires introduction of a polishing slurry as the wafer is being mechanically polished against a rotating polishing pad. Slurries typically are water based and can contain fine abrasive particles such as silica, alumina, and other abrasive materials. After CMP is complete, the wafers are exposed to cleaning chemistries to remove residual slurry and other residue in order to prepare the wafer for subsequent fabrication utilizing techniques such as etching, photolithography, ion-implantation and the like.

Cleaning chemistries may be delivered to the post-CMP wafer cleaner directly from a bulk supply of a particular fabrication facility. However, the flow of cleaning chemistry from the bulk supply may vary depending upon demands placed upon the bulk supply by other post-CMP cleaning systems.

Therefore, liquid delivery modules having a cleaning chemistry storage capacity are frequently employed to dispense cleaning chemistry for post-CMP wafer cleaning. This configuration renders the flow of cleaning chemistry to the post-CMP cleaning tool essentially independent of the flow of cleaning chemistry from the bulk supply.

Because of the need for rapid throughput of polished wafers to be cleaned, it is desirable that the liquid dispense module provide a continuous flow of cleaning chemistry, interrupted only by the transfer of a cleaned wafer out of the cleaner and the loading of the next wafer to be cleaned. In addition, due to space considerations and the need for ease of servicing, it is desirable that the liquid dispense module occupy as little space as possible, and also that the design of the liquid dispense module be relatively simple to permit ready access to various components of the device. Accordingly, new compact and simple designs for liquid delivery modules to dispense fluids utilized in semiconductor fabrication process are desirable.

SUMMARY OF THE INVENTION

The present invention relates to liquid delivery module for a semiconductor process that is compact and of simple construction. Specifically, one embodiment of a liquid delivery module in accordance with the present invention features two chambers linked to each other through a valve assembly. In a non-refill module state, the chambers are in fluid communication with each other and act as a single vessel. Positive pressure applied to the module results in the dispensing of liquid material.

When liquid material within the delivery module becomes depleted, in a refill module state the chambers are sealed off from one another to permit refilling. One chamber remains pressurized to allow the remaining material to be supplied to complete processing of the wafer. The second chamber is vented and placed into fluid communication with the material supply.

Once the level of material second chamber has been restored, and once supply of liquid material to the wafer being processed has been completed, during transfer of the processed wafer the second chamber is sealed off from the material supply, pressurized, and again placed back into fluid communication with the first chamber. This permits dispensing to continue uninterrupted with the next wafer.

One embodiment of a delivery module in accordance with the present invention comprises a vessel including a first chamber and a second chamber, the vessel configured to receive the material from a bulk supply and to receive a pressurized flow of gas from a gas source. The delivery module further comprises a valve assembly operable to selectively permit fluid communication between the first chamber and the second chamber during a non-refill module state, and to prevent fluid communication between the first chamber and the second chamber during a refill module state.

One embodiment of a method of delivering material to a semiconductor processing tool in accordance with the present invention comprises supplying a pressurized flow of an inert gas to a first chamber of a vessel containing the material, such that the material in the first chamber flows out of the first chamber to the semiconductor processing tool. In a refill state, while dispensing the material to the semiconductor processing tool from the first chamber, a second chamber of the vessel is vented and the material is supplied to the second chamber from a bulk material supply. In a non-refill state, the second chamber is sealed from the environment and placed in fluid communication with the first chamber, such that the material flows from the first chamber to the semiconductor processing tool.

These and other embodiments of the present invention, as well as its advantages and features, are described in more detail in conjunction with the text below and attached figures.

DESCRIPTION OF THE SPECIFIC EMBODIMENTS

Figure 1:
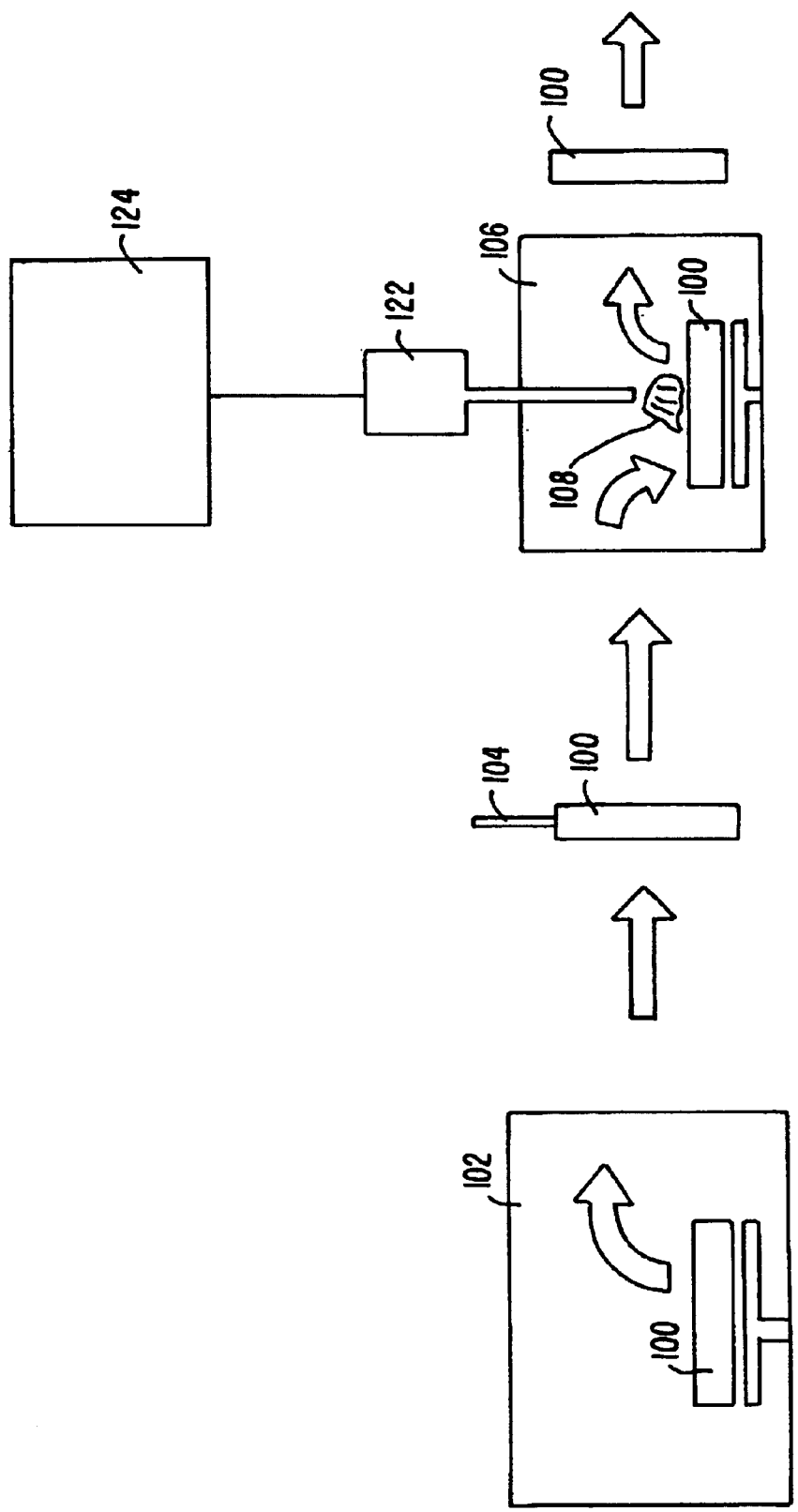
FIG. 1 shows a simplified schematic view of a CMP tool and a post-CMP cleaner configured to operate in conjunction with a liquid delivery module in accordance with one embodiment of the present invention.

I. An Exemplary Post-CMP Cleaning System Configured to Practice the Present Invention FIG. 1 shows a simplified schematic view of a CMP tool and an associated wafer cleaning apparatus. The CMP tool and the wafer cleaner may be modular in design, for example the integrated MIRRA MESA™ CMP tool which includes a post-CMP wafer cleaner, manufactured by Applied Materials Inc. of Santa Clara, Calif.

As shown in FIG. 1, wafer 100 polished in CMP tool 102 is transferred by robot arm 104 to post-CMP wafer cleaner 106. In wafer cleaner 106, polished wafer 100 is exposed to cleaning chemistry 108 such that slurry and other polishing residues are removed. A rinsing step may follow the wafer cleaning step, prior to transfer of the cleaned and rinsed wafer 100 to the next step in the fabrication process.

Cleaning chemistry 108 is supplied to wafer cleaner 106 from liquid delivery module 122. Because liquid delivery module 122 has storage capacity for post-CMP cleaning chemistry in turn received from bulk supply 124, liquid delivery module 122 can dispense the cleaning chemistry to post-CMP cleaner 106 independent of variation in the flow of cleaning material from bulk supply 124.

Details of the design and operation of the liquid delivery module are discussed below.

II. A Pressurized Liquid Delivery Module in Accordance With One Embodiment of the Present Invention.

As described above, during a post-CMP cleaning process, cleaning chemistry is provided to the surface of the polished wafer from a pressurized liquid delivery module. However, the volume of the liquid delivery module is limited, and as successive polished wafers are cleaned the delivery module is refilled from the bulk cleaning chemistry supply.

To allow uninterrupted operation of the post-CMP cleaning tool and the benefit of high throughput conveyed thereby, refill of a delivery module in accordance with the present invention can occur during wafer cleaning. This is because module refill and dispense operations take place in different chambers of the module.

Figure 2:
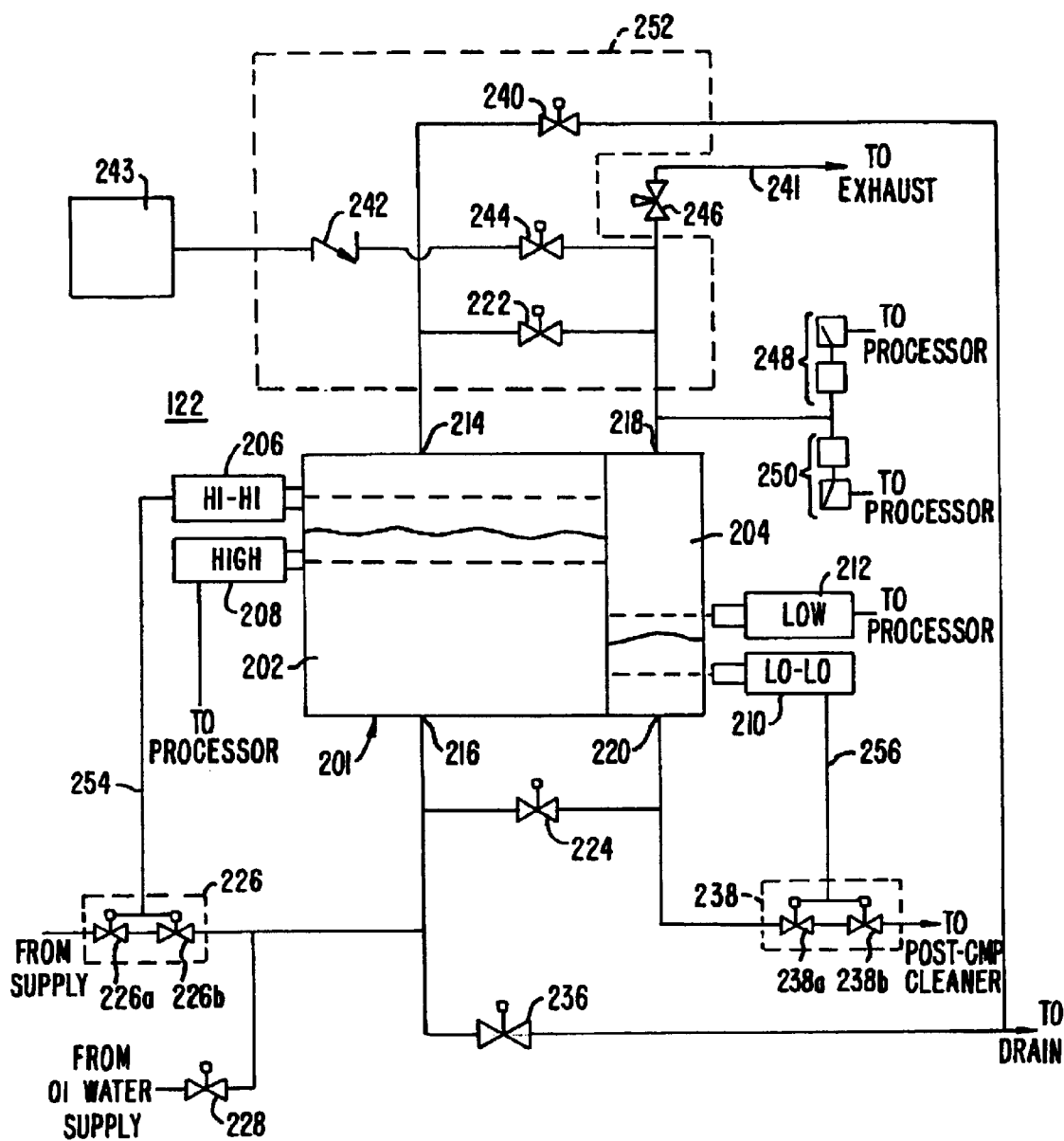
FIG. 2 shows a schematic view of one embodiment of a liquid delivery module in accordance with the present invention.

FIG. 2 shows a schematic view of one embodiment of a liquid delivery module in accordance with the present invention. Liquid delivery module 122 comprises vessel 201 including first, larger volume chamber 202 as well as second, smaller volume chamber 204. First chamber 202 includes first, "hi—hi" fluid level sensor 206 positioned above second, "high" fluid level sensor 208. Second chamber 204 includes third, "lo—lo" fluid level sensor 210 positioned below fourth, "low" fluid level sensor 212. Sufficient volume is present between third sensor 210 and fourth sensor 212 for enough cleaning material to clean an entire wafer. This ensures that a post-CMP wafer cleaning operation will not be interrupted if module refill is triggered just after a new wafer cleaning operation has commenced.

First, second, third, and fourth fluid level sensors 206, 208, 210, and 212 may be one of any number of different types of fluid sensing structures, including but not limited to capacitive-type fluid level sensors. The fluid level sensors may be triggered by the presence or absence of fluid at the level of the sensor.

First chamber 202 includes a top port 214 and a bottom port 216. Second chamber 204 includes a top port 218 and a bottom port 220.

First and second chambers 202 and 204 are in fluid communication with each other through their respective top ports 214 and 218 via first control valve 222. First and second chambers 202 and 204 are in fluid communication with each other through their respective bottom ports 216 and 220 via second control valve 224.

Bottom port 216 of first chamber 202 is in fluid communication with a bulk liquid material supply through material supply valve 226. Material supply valve 226 may actually include first material supply valve 226a in series with second material supply valve 226b for safety purposes.

Bottom port 216 of first chamber 202 is also in fluid communication with a distilled water supply through distilled water valve 228. Bottom port 216 of first chamber 202 is further in fluid communication with the drain through drain valve 236.

Bottom port 220 of second chamber 204 is in fluid communication with the post-CMP wafer cleaner through dispense valve 238. Dispense valve 238 may also include first dispense valve 238a in series with second dispense valve 238b for safety purposes.

Top port 214 of first chamber 202 is in fluid communication with first pressure valve 222. In addition, top port 214 is in fluid communication with the drain through vent valve 240.

Top port 218 of second chamber 204 is in fluid communication with pressurized inert gas supply 243 through check valve 242 and gas inlet valve 244. Top port 218 of second chamber 204 is also in fluid communication with exhaust port 241 through pressure release valve 246. Pressure relief valve 246 has a set cracking pressure and is used to prevent chamber 204 from becoming overpressurized.

In addition to the mechanical pressure relief provided by pressure relief valve 246, the pressure of second chamber 204 is monitored by first pressure sensor 248 in combination with second pressure sensor 250. First pressure sensor 248 is triggered when the pressure at top port 218 exceeds a predetermined first threshold pressure. Conversely, second pressure sensor 250 is triggered when the pressure at top port 218 falls below a predetermined second threshold pressure. Both first pressure sensor 248 and second pressure sensor 250 are in communication with a processor and warn the user through the processor of a pressure problem.

Valves 222, 240 and 244 are part of block manifold 252. Valves, 222, 240 and 244 are all interlocked to a cover switch in the module. These valves are arranged so that both sides of the valves are vented to exhaust and depressurize the vessel whenever the cover is removed for maintenance purposes.

The pressure sensors and the pressure relief valve act in tandem to control pressure within the second chamber. Specifically, the pressure sensors provide initial warning to the operator of possible pressure problems, and the pressure relief valve automatically relieves pressure after a certain pressure has been reached. This redundant feature is especially valuable given the potential safety hazard posed by overpressurization of the delivery module.

Hi—hi sensor 206 is in direct communication with supply valves 226a and 226b through first link 254. Triggering of hi—hi sensor 206 automatically shuts off supply valve 226, such that overfilling of first chamber 202 during operation module is avoided. Similarly, lo—lo sensor 210 is in direct communication with dispense valves 238a and 238b through second link 256, such that complete draining of second chamber 204 during tool operation is avoided.

Operation of pressurized liquid delivery module 122 is now described in detail below.

III. Initial Module Fill State

Initially, first and second chambers 202 and 204 are empty. During an initial filling process, first control valve 222 is opened, second control valve 224 is closed, gas supply valve 244 is closed, and vent valve 240 is opened. Material supply valve 226 is opened, and drain valve 236 is closed. As a result of this initial fill configuration, material flows from the bulk supply through material supply valve 226 into bottom port 216 of vented first chamber 202 until high level sensor 208 triggers. Supply valve 226 is then closed to halt filling of the module.

Second control valve 224 is opened to allow chamber 202 and chamber 204 to operate together as a single chamber. Fluid levels in first chamber 202 and second chamber 204 then equalize. Inert gas supply valve 244 is then opened and vent valve 240 closed, causing second chamber 204 and first chamber 202 to become pressurized. Dispense valve 238 is also opened, and as a result of the positive pressure within first vessel 202 and second vessel 204, material flows out of bottom port 220 of second chamber 204 through dispense valve 238 to the post-CMP cleaner. Material also flows directly from first chamber 202 through open second control valve 224 to the semiconductor processing tool.

IV. Refill Module State

In accordance with one embodiment of a method for operating the delivery module, dispensing of material to the post-CMP wafer cleaner continues until the fluid level in second chamber 204 falls below and triggers "low" sensor 212. When this occurs, the bulk material supply is alerted to the need to prepare additional cleaning chemistry to be provided to the delivery module. Both first control valve 222 and second control valve 224 are closed, and vent valve 240 is opened. As a result of this changed configuration, first chamber 202 is isolated from second chamber 204. First chamber 202 assumes ambient pressure while second chamber 204 remains pressurized. Material remaining in second chamber 204 continues to flow to the post-CMP wafer cleaner through dispense valve 238.

Supply valve 226 is opened and material flows into first chamber 202 until high fluid level sensor 208 is triggered. Once high fluid level sensor 208 is triggered, supply valve 226 is closed and vent valve 240 is closed. Dispensing of the cleaning chemistry during this module refill state continues exclusively from second chamber 204 until cleaning of the wafer in process has concluded. As described above, the spacing between low level sensor 212 and lo—lo level sensor 210 ensures that a sufficient volume of cleaning chemistry is present in the second chamber to allow completion of cleaning of the wafer present in the post-CMP cleaner when the module refill state is triggered.

Once cleaning of the wafer in the post-CMP cleaner has been completed, valves 238a and 238b are closed to halt the flow of cleaning chemistry. The wafer is rinsed and transferred to the next stage, and is replaced by a new incoming polished wafer. During this rinsing/transfer period between wafer cleaning, first and second control valves 222 and 224 are opened such that fluid is transferred from first chamber 202 to refill second chamber 204. A transitory change in pressure occurs in the first and second chambers as a result of placing the chambers back into fluid communication with one another. However, as cleaning chemistry is not being flowed to the post-CMP wafer cleaner at this time, the transitory change in pressure in chambers 202 and 204 does not adversely affect the post-CMP wafer cleaning process.

As described above, the delivery module is designed to ensure that a sufficient volume of cleaning chemistry to clean an entire wafer is available between low level sensor 212 and lo—lo level sensor 210. If for some reason however, the level of material in second chamber 204 does fall below and trigger lo—lo sensor 210, the wafer cleaning process is interrupted. Supply valves 226a and 226b are automatically closed through link 256. Vent valve 240 is closed. First control valve 222 and second control valve 224 are opened to equalize the level of liquid in first chamber 202 and in second chamber 204. This ensures that vessel 201 (and specifically second chamber 204) will not run completely dry.

One feature of the embodiment of the delivery module just described is prolonged operation. Specifically, as cleaning chemistry is accessible to the post-CMP cleaning tool even during module refill, interruption of a wafer cleaning process is avoided. Another feature of the embodiment of the delivery module just described is its compact size, which makes the footprint of the delivery module as small as possible.

A further feature of this embodiment of the present invention is simplicity of structure. Specifically, the module comprises two chambers in fluid communication with each other through external valve and tubing structures. This renders the valves and connecting tubing readily accessible for repair or replacement. Another aspect of the embodiment of the present invention just described is economy of fabrication. The module comprises two chambers that communicate with each other through external links. This simplifies the structure of the vessel, and allows the delivery module to readily be fabricated in a variety of ways from a variety of materials. Of course, the material used to fabricate the vessel, tubing, and valves must be compatible with the liquid material that is to be delivered.

V. Alternative Embodiments

Having fully described at least one embodiment of the present invention, other equivalent or alternative structures and methods for supplying material to a semiconductor fabrication tool according to the present invention will be apparent to those skilled in the art.

For example, while the present invention was described primarily above in connection with delivery of liquid cleaning chemistries for post-CMP wafer cleaning, the present invention is not restricted to this particular application. A variety of other types of liquid materials, including but not limited to CMP slurry or undeveloped photoresist, could also be dispensed to respective semiconductor tools utilizing a delivery module in accordance with the present invention.

In addition, while the present invention has primarily been described above in conjunction with an embodiment wherein change between the non-refill module state and the refill module state was triggered by fluid sensors, this is not required by the present invention. In accordance with an alternative embodiment of methods of operating a dispense module in accordance with the present invention, the change between non-refill and refill module states could be passively triggered on a per-wafer basis, rather than actively triggered by monitoring fluid levels within the module.

In such an alternative embodiment, once initial filling of the delivery module has taken place, material is dispensed until refill is indicated by completion of processing of a predetermined number of wafers. In such an alternative embodiment, the number of wafers to be processed before module refill would have to be carefully evaluated by repeated operation of the semiconductor processing tool under controlled conditions. However, once consumption of liquid material on a per wafer basis had been precisely established, the delivery module could be operated with sufficient confidence that it would not run completely dry.

One aspect of the alternative embodiment of a method of operation just described is higher volume operation, as maximum volumes of liquid material may be rapidly dispensed by the module. However, in this alternative embodiment the faster turnover rate of liquid would result in refilling of the delivery module more often. This in turn involves more frequent venting of the first chamber, leading to potential alteration in the composition of the contents of the first chamber due to higher rates of evaporation of more volatile components of the liquid. The resulting minor but definite change in material composition should be considered in implementing the high volume, per-wafer refill mode of operation.

Figure 3:
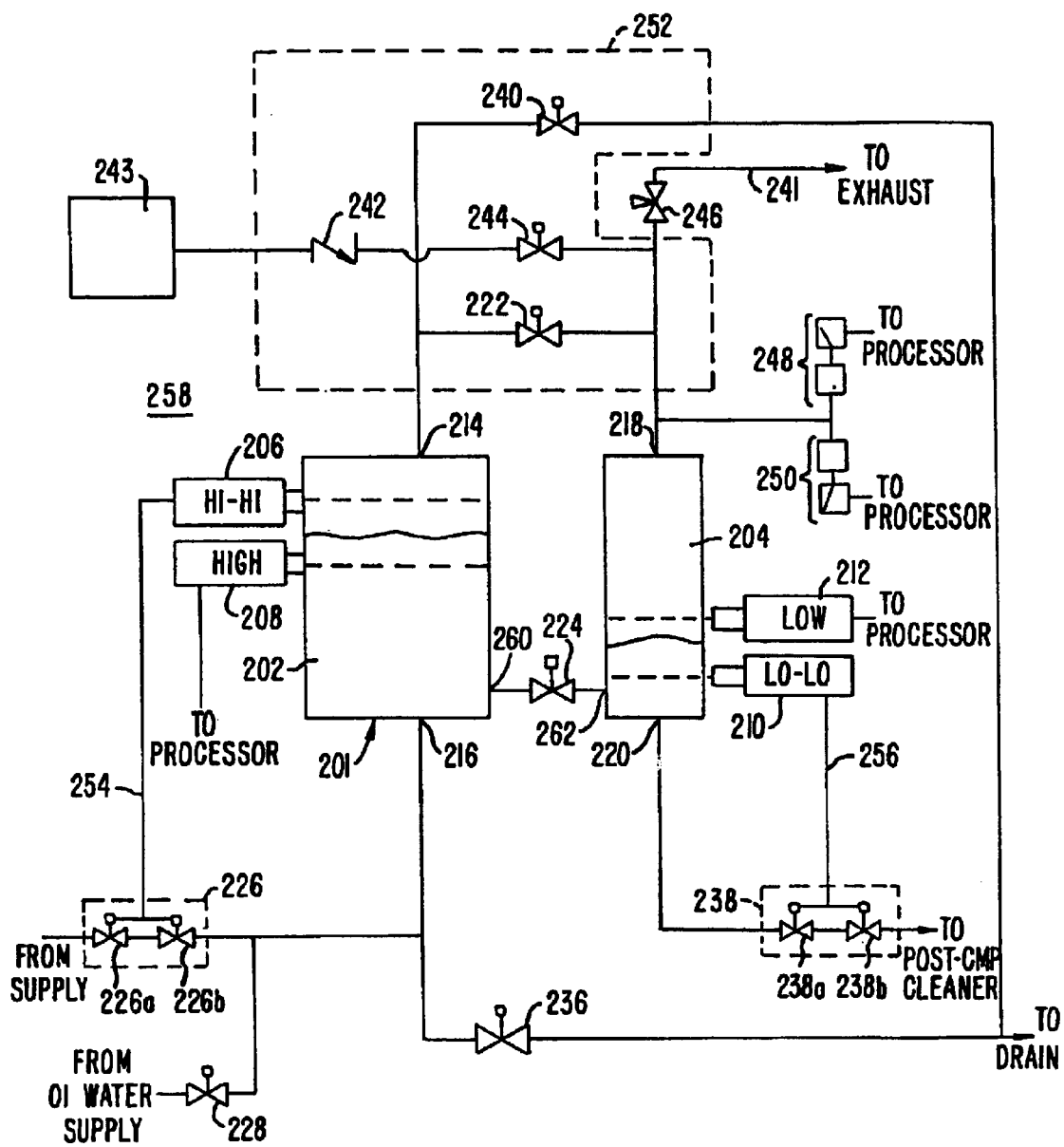
FIG. 3 shows a schematic view of an alternative embodiment of a liquid delivery module in accordance with the present invention.

While FIG. 2 provides a specific orientation of valves in accordance with one embodiment of the present invention, the present invention is not limited to this specific configuration. FIG. 3 shows the structure of an alternative embodiment of a delivery module in accordance with the present invention.

Second embodiment 258 of the pressurized dispense module features the same two-chamber structure and valve assembly as shown in the embodiment of a pressurized dispense module of FIG. 2, except that first chamber 202 includes third port 260, and second chamber 204 includes a third port 262. Second control valve 224 is positioned between third port 260 of first chamber 202 and third port 262 of second chamber 204, such that all material ultimately dispensed to the semiconductor processing tool must flow through second chamber 204. This is unlike the first embodiment shown in FIG. 2, in which the material may flow directly from the first chamber to the post-CMP wafer cleaner via external second control valve 224.

The alternative module design just described would permit more rapid transfer of fluid between the chambers, owing to a more direct connection between them. Specifically, rather than requiring the flow of liquid material between the chambers to occur through external tubing and valves, flow between the chambers would occur through a valve positioned therebetween. This direct connection permits more rapid flow between the chambers, and would prevent low sensor 212 from being triggered as quickly as where replenishment of the second chamber from the first chamber is delayed by indirect flow between the chambers.

Given the above detailed description of the present invention and the variety of embodiments described therein, these equivalents and alternatives along with the understood obvious changes and modifications are intended to be included within the scope of the present invention.

What is claimed is:

1. A module for dispensing material to a semiconductor processing tool, the module comprising:
   a vessel defining a first integral chamber and a second integral chamber separated by a common wall, the first chamber includes a first port and a second port, the vessel configured to receive the material from a bulk supply and to receive a pressurized flow of gas from a gas source, the second chamber configured to be in fluid communication with the semiconductor fabrication tool through a first port and with a pressurized gas supply through a second port; and
   a valve assembly external from the vessel and operable to selectively permit fluid communication between the first chamber and the second chamber during a non-refill module state and to prevent fluid communication between the first chamber and the second chamber during a refill module state, the valve assembly including,
      a first control valve positioned between the first port of the first chamber and the first port of the second chamber,
      a second control valve positioned between the second port of the first chamber and the second port of the second chamber,
      a material supply valve positioned between the first port of the first chamber and a bulk material supply,
      a vent valve positioned between the second port of the first chamber and an outside environment;
      such that in the non-refill module state the first and second control valves are open, the material supply valve is closed, and the vent valve is closed, and in the refill module state the first and second control valves are closed, the material supply valve is open, and the vent valve is open.

2. The module of claim 1 further comprising:
   a dispense valve positioned between the second port of the second chamber and the semiconductor processing tool; and
   a first fluid level sensor positioned in the second chamber and in electrical communication with the dispense valve, such that triggering of the first fluid level sensor automatically closes the dispense valve.

3. The module of claim 2 further comprising:
   a processor, and
   a second fluid level sensor positioned in the second chamber at a level above the first fluid level sensor, the second fluid level sensor in communication with the processor such that triggering the second fluid level sensor automatically initiates a change from the non-refill module state to the refill module state.

4. The module of claim 2 further comprising a first fluid level sensor positioned in the first chamber and in electrical communication with the material supply valve, such that triggering of the first fluid level sensor automatically closes the material supply valve.

5. The module of claim 4 further comprising:
   a processor; and
   a second fluid level sensor positioned in the first chamber at a level below the first fluid level sensor, the second fluid level sensor in communication with a processor such that triggering of the second fluid level sensor initiates a change from the refill module state to the non-refill module state.

6. A module for dispensing material to a semiconductor processing tool, the module comprising:
   a vessel defining a first integral chamber and a second integral chamber separated by a common wall, the first chamber includes a first port, a second port, and a third port the vessel configured to receive the material from a bulk supply and to receive a pressurized flow of gas from a gas source, the second chamber the second chamber includes a first port, a second port, and a third port, the second chamber configured to be in fluid communication with the semiconductor fabrication tool through the first port and with a pressurized gas supply through the second port; and
   a valve assembly external from the vessel and operable to selectively permit fluid communication between the first chamber and the second chamber during a non-refill module state and to prevent fluid communication between the first chamber and the second chamber during a refill module state, the valve assembly including,
      a first control valve positioned between the first port of the first chamber and the first port of the second chamber,
      a second control valve positioned between the third port of the first chamber and the third port of the second chamber,
      a material supply valve positioned between the second port of the first chamber and a bulk material supply,
      a vent valve positioned between the first port of the first chamber and an outside environment;
      such that in the non-refill module state the first and second control valves are open, the material supply valve is closed, and the vent valve is closed, and in the refill module state the first and second control valves are closed, the material supply valve is open, and the vent valve open.

7. The module of claim 6 further comprising:
   a dispense valve positioned between the second port of the second chamber and the semiconductor processing tool; and
   a first fluid level sensor positioned in the second chamber and in electrical communication with the dispense valve, such that triggering of the first fluid level sensor automatically closes the dispense valve.

8. The module of claim 7 further comprising:
   a processor; and
   a second fluid level sensor positioned in the second chamber at a level above the first fluid level sensor, the second fluid level sensor in communication with the processor such that triggering of the second fluid level sensor automatically initiates a change from the non-refill module state to the refill module state.

9. The module of claim 7 further comprising a first fluid level sensor positioned in the first chamber and in electrical communication with the material supply valve, such that triggering of the first fluid level sensor automatically closes the material supply valve.

10. The module of claim 9 further comprising:

a processor, and a second fluid level sensor positioned in the first chamber at a level below the first fluid level sensor, the second fluid level sensor in communication with a processor such that triggering of the second fluid level sensor initiates a change from the refill module state to the non-refill module state.

11. A module for dispensing material to a semiconductor processing tool, the module comprising:

a vessel defining an integral first chamber and an integral second chamber separated by a common wall;

the first chamber including a first port and a second port, the first port configured to receive the material from a bulk supply through a material supply valve, and the second port in communication with an external environment through a vent valve, the second chamber including a fluid level sensor, a first port, and a second port, the first port of the second chamber in fluid communication with a semiconductor processing tool through a dispense valve, the second port of the second chamber configured to receive a pressurized flow of gas from a pressurized gas supply through a gas inlet valve;

an external pressure release valve in communication with the second port of the second chamber, the pressure release valve also in communication with the external environment;

an external first control valve positioned between the first port of the first chamber and the first port of the second chamber; and an external second control valve positioned between the second port of the first chamber and the second port of the second chamber, such that in the non-refill module state the first and second control valves are open, the material supply valve is closed, and the vent valve is closed, and in the refill module state the first and second control valves are closed, the material supply valve is open, and the vent valve is open, and transition between the non-refill module state and the module refill state is triggered by a drop in the material below the fluid level sensor.

* * * * *